(12) United States Patent
Shin

(10) Patent No.: US 11,337,305 B1
(45) Date of Patent: May 17, 2022

(54) PRINTED CIRCUIT BOARD AND INSULATING FILM USED THEREIN

(71) Applicant: SAMSUNG ELECTRO-MECHANICS CO., LTD., Suwon-si (KR)

(72) Inventor: Dong Joo Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/208,170

(22) Filed: Mar. 22, 2021

(30) Foreign Application Priority Data

Dec. 4, 2020 (KR) .................. 10-2020-0168785

(51) Int. Cl.
*H05K 1/02* (2006.01)
*H05K 1/03* (2006.01)
*H01Q 1/38* (2006.01)

(52) U.S. Cl.
CPC ............. *H05K 1/0373* (2013.01); *H01Q 1/38* (2013.01); *H05K 1/0271* (2013.01); *H05K 2201/0154* (2013.01); *H05K 2201/0209* (2013.01); *H05K 2201/0227* (2013.01); *H05K 2201/0263* (2013.01); *H05K 2201/068* (2013.01); *H05K 2201/09509* (2013.01); *H05K 2201/10098* (2013.01)

(58) Field of Classification Search
CPC ............... H05K 1/0373; H05K 1/0271; H05K 2201/0227
See application file for complete search history.

(56) References Cited

U.S. PATENT DOCUMENTS

2009/0118408 A1   5/2009   Cox et al.

FOREIGN PATENT DOCUMENTS

KR   10-2009-0046711 A   5/2009

*Primary Examiner* — Jeremy C Norris
(74) *Attorney, Agent, or Firm* — Morgan Lewis & Bockius LLP

(57) ABSTRACT

A printed circuit board includes: an insulating layer including an insulating resin and first fillers dispersed in the insulating resin; and a wiring layer disposed on the insulating layer. The first filler includes a core, and a shell coated on a surface of the core, and the shell has a dielectric constant higher than that of the core.

27 Claims, 7 Drawing Sheets

PRINTED CIRCUIT BOARD AND INSULATING FILM USED THEREIN

CROSS-REFERENCE TO RELATED APPLICATION(S)

This applications claims benefit of priority to Korean Patent Application No. 10-2020-0168785 filed on Dec. 4, 2020 in the Korean Intellectual Property Office, the disclosure of which is incorporated herein by reference in its entirety.

TECHNICAL FIELD

The present disclosure relates to a printed circuit board and an insulating film used therein.

BACKGROUND

In accordance with the miniaturization and multifunctionalization of digital electronic products, functions of high-end components have also been improved. Also, in a case of a printed circuit board (PCB), thinness and high integration steps and fine circuit development of the PCB have been conducted in order to cope with high specifications. In particular, a 5G antenna board has required characteristics such as a low shrinkage rate and a high dielectric constant of a board material suitable for high-speed communications.

SUMMARY

An aspect of the present disclosure is to provide an insulating layer capable of having a low coefficient of thermal expansion (CTE) and a printed circuit board including the same.

Another aspect of the present disclosure is to provide an insulating layer having a high dielectric constant and a printed circuit board including the same.

According to an aspect of the present disclosure, a printed circuit board may include: an insulating layer including an insulating resin and first fillers dispersed in the insulating resin; and a wiring layer disposed on the insulating layer, wherein the first filler includes a core, and a shell coated on a surface of the core, and the shell has a dielectric constant higher than that of the core.

According to another aspect of the present disclosure, a printed circuit board may include: a plurality of insulating layers; a plurality of wiring layers disposed on or between the plurality of insulating layers; and a via layer penetrating through at least one of the plurality of insulating layers and electrically connecting the plurality of wiring layers to each other, wherein at least one of the plurality of insulating layers includes an insulating sheet and insulating resins disposed on both surfaces of the insulating sheet, the insulating resins and the insulating sheet include first and second fillers, respectively, and a density of the second fillers per unit volume in the insulating sheet is higher than that of the first fillers per unit volume in each of the insulating resins of the plurality of layers.

According to another aspect of the present disclosure, an insulating film may include: an insulating resin; and fillers dispersed in the insulating resin and each including a core, and a shell coated on a surface of the core, wherein the shell has a dielectric constant higher than that of the core, and the shell has a coefficient of thermal expansion (CTE) greater than that of the core.

According to another aspect of the present disclosure, a printed circuit board may include: an insulating layer including an insulating resin and first fillers dispersed in the insulating resin; and a wiring layer disposed on the insulating layer. The first filler may include a core including a first material, and a shell coated on a surface of the core and including a second material. One of the first material and the second material may have a dielectric constant and a coefficient of thermal expansion (CTE) greater than the other of the first material and the second material.

According to another aspect of the present disclosure, a printed circuit board may include: a first wiring layer and a second wiring layer; a first insulating resin layer and a second insulating resin layer disposed between the first wiring layer and the second wiring layer and each dispersed with fillers, wherein the fillers includes a core and a shell coated on the core and having a dielectric constant or a coefficient of thermal expansion (CTE) different from that of the core; an insulating sheet disposed between the first insulating resin layer and the second insulating resin layer; and a via layer extending between the first wiring layer and the second wiring layer and penetrating through the first insulating resin layer, the insulating sheet, and the second insulating resin layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
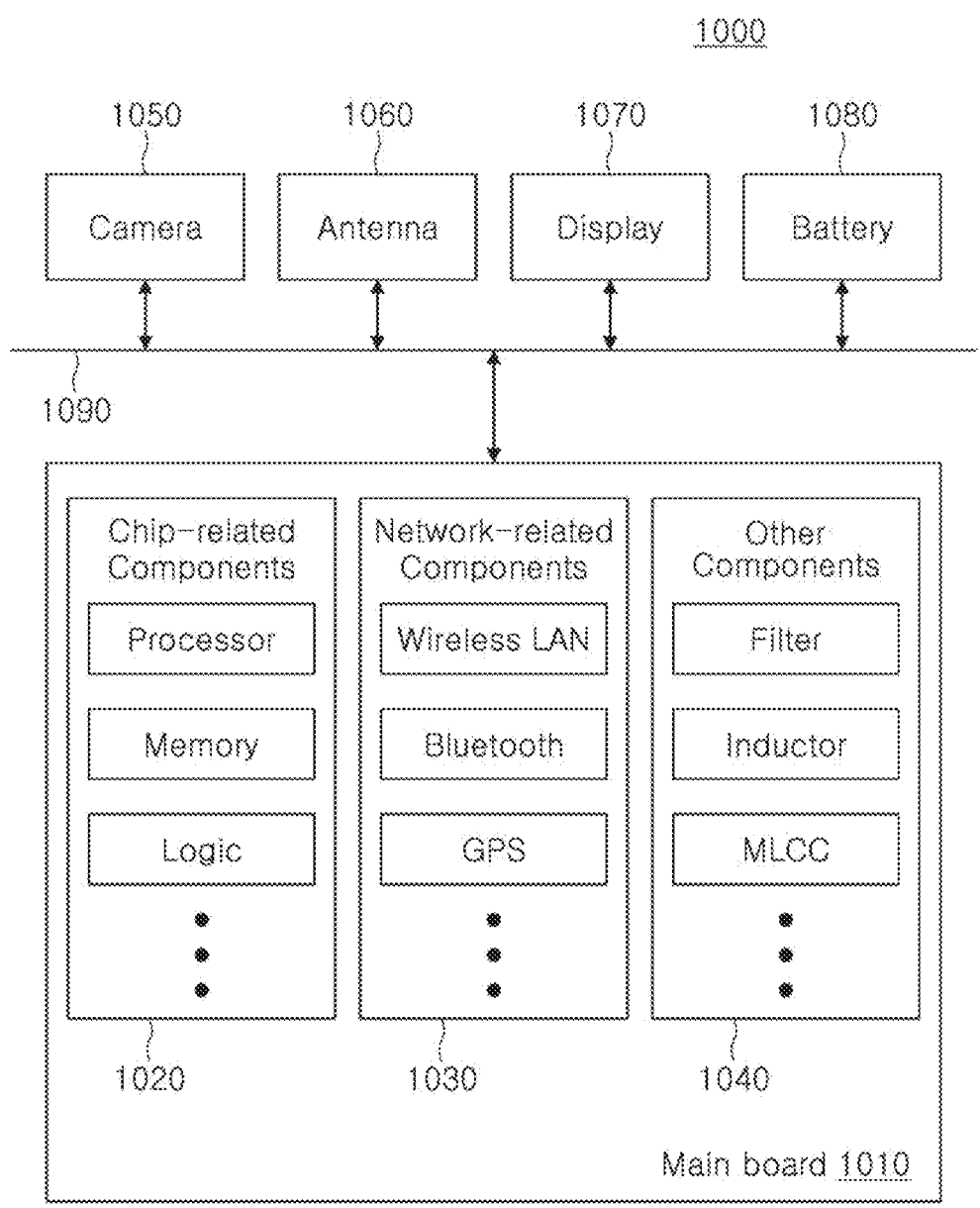
FIG. 1 is a schematic block diagram illustrating an example of an electronic device system.

Hereinafter, exemplary embodiments of the present disclosure will now be described in detail with reference to the accompanying drawings.

Hereinafter, exemplary embodiments in the present disclosure will be described with reference to the accompanying drawings. In the accompanying drawings, shapes, sizes, and the like, of components may be exaggerated or shortened for clarity.

Herein, expressions such as a side portion and a side surface are used to refer to a left/right direction or a surface in the left/right direction in the drawings for convenience, expressions such as an upper side, an upper portion, and an upper surface are used to refer to an upward direction or a surface in the upward direction in the drawings for convenience, and expressions such as a lower side, a lower portion, and a lower surface are used to refer to a downward direction or a surface in the downward direction in the drawings for convenience. In addition, "positioned on the side portion, on the upper side, above, on the lower side, or below" conceptually includes a case in which a target component is positioned in a corresponding direction, but does not be in direct contact with a reference component, as well as a case in which the target component is in direct contact with the reference component in the corresponding direction. However, these directions are defined for convenience of explanation, and the claims are not particularly limited by the directions defined as described above, and concepts of upper and lower portions may be exchanged with each other at any time.

The meaning of a "connection" of a component to another component in the description conceptually includes an indirect connection through an adhesive layer as well as a direct connection between two components. In addition, "electrically connected" conceptually includes a physical connection and a physical disconnection. It may be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-digital converter (ADC), an application-specific integrated circuit (ASIC), or the like. However, these chip related components 1020 are not limited thereto, and may also include other types of chip related components. In addition, these chip related components may be combined with each other. These chip related components 1020 may have a package form including the chips described above.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, such network related components 1030 may be combined with the chip related components 1020 to be provided in a package form.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, these other components 1040 are not limited thereto, but may also include chip component types of passive components used for various other purposes, or the like. In addition, these other components 1040 may be combined with the chip related components 1020 and/or the network related components 1030 to be provided in a package form.

Depending on a type of the electronic device 1000, the electronic device 1000 may include other components that may or may not be physically or electrically connected to the mainboard 1010. These other electronic components may include, for example, a camera 1050, an antenna 1060, a display 1070, a battery 1080, or the like. These other electronic components are not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other electronic components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
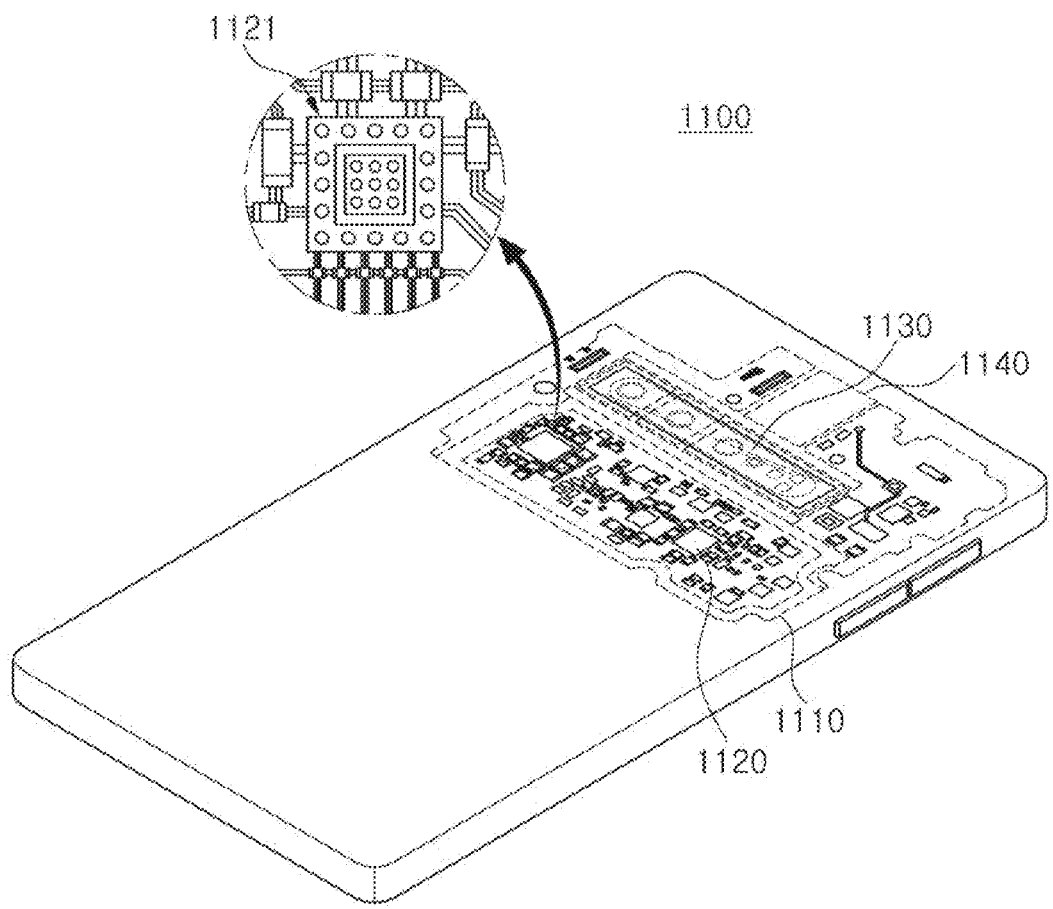
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A motherboard 1110 may be accommodated in the smartphone 1100, and various electronic components 1120 may be physically or electrically connected to the motherboard 1110. In addition, a camera module 1130 and/or a speaker 1140 may be accommodated in the motherboard 1110. Some of the electronic components 1120 may be the chip related components described above, for example, an electronic component embedded board 1121, but are not limited thereto. The electronic component embedded board 1121 may have a form in which electronic components are embedded in a multilayer printed circuit board, but is not limited thereto. Meanwhile, the electronic device is not necessarily limited to the smartphone 1100, but may be other electronic devices as described above.

Figure 3:
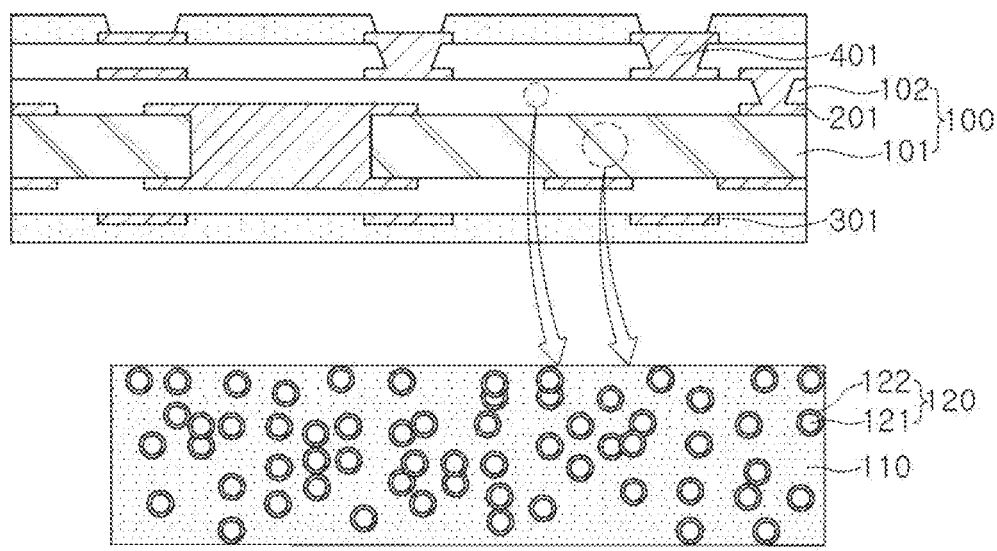
FIG. 3 is a schematic cross-sectional view illustrating a printed circuit board according to a first exemplary embodiment in the present disclosure.

FIG. 3 is a schematic cross-sectional view illustrating a printed circuit board according to a first exemplary embodiment in the present disclosure.

The printed circuit board 100A according to the first exemplary embodiment may include an insulating layer 101 and a build-up insulating layer 102 that include an insulating resin 110 and first fillers 120 dispersed in the insulating resin 110, and wiring layers 201 disposed on the insulating layers 101 and 102. Here, each of the first fillers 120 may include a core 121 and a shell 122 coated on a surface of the core 121. When the printed circuit board 100A described above is an antenna board, the printed circuit board 100A may also include antenna patterns 301.

Respective components of the printed circuit board 100A according to the first exemplary embodiment will hereinafter be described in more detail.

A material of the insulating resin 110 may be any material having an electrical insulating property, for example, a thermosetting resin such as an epoxy resin or a thermoplastic resin such as a polyimide resin. Alternatively, the material of the insulating resin 110 may be a material having a reinforcing material such as an inorganic filler such as silica or the like, like the first fillers 120 according to the present disclosure, a glass fiber, or the like, included in the thermosetting resin and the thermoplastic resin. For example, prepreg may be used as the material of the insulating resin 110 or a photoimagable dielectric (PID) may be used as the material of the insulating resin 110. Since a fine pattern is more easily formed on the insulating layer 110 in a case of using the PID than in a case of using mechanical machining or the like, the case of using the PID may be advantageous in manufacturing a high density printed circuit board. Alternatively, Ajinomoto Build-up Film (ABF) may be used as the material of the insulating resin 110. In this case, the ABF may be provided in a resin coated copper (RCC) form, but is not limited thereto.

A material of each of the wiring layers 201 may be a metal material such as copper (Cu), aluminum (Al), silver (Ag), tin (Sn), gold (Au), nickel (Ni), lead (Pb), titanium (Ti), or alloys thereof. The wiring layers 201 may perform various functions depending on a design. For example, the wiring layers 201 may include ground patterns, power patterns, signal patterns, and the like. These patterns may have a line, plane, or pad form, respectively. Each of the wiring layers 201 may be formed by a plating process such as an additive process (AP), a semi-additive process (SAP), a modified semi-additive process (MSAP), tenting (TT), or the like, and may resultantly include a seed layer, an electroless plating layer, and an electroplating layer formed on the basis of the seed layer.

Meanwhile, in printed circuit boards 100A, 100B, 100C, and 100D according to first to fourth exemplary embodiments in the present disclosure, the insulating layer 101 may be configured as a plurality of layers, and a plurality of build-up insulating layers 102 may be built up on the insulating layer 101.

A description based on the insulating layer 101 will hereinafter be applied to both of the insulating layer 101 and the build-up insulating layer 102 illustrated in FIG. 3 of the present disclosure.

Meanwhile, the insulating layer 101 and the build-up insulating layer 102 may be collectively referred to as an insulating body 100 for convenience. The insulating body 100 may be used as a concept including the insulating layer 101 and the build-up insulating layer 102, and when the insulating body 100 does not include the build-up insulating layer 102, the insulating body 100 may refer to only the insulating layer 101.

At least one layer of the insulating body 100 may include the insulating resin 110 in which the first fillers 120 described above are dispersed.

A material of another insulating layer in the insulating body 100 that does not include the insulating resin 110 may be an insulating material. In this case, the insulating material may be a thermosetting resin such as an epoxy resin or a thermoplastic resin such as a polyimide resin. Alternatively, the material of another insulating layer in the insulating body 100 that does not include the insulating resin 110 may be a material having a reinforcing material such as a glass fiber or the like included in the thermosetting resin and the thermoplastic resin. For example, the material of another insulating layer in the insulating body 100 that does not include the insulating resin 110 may be prepreg, but is not limited thereto. Alternatively, for example, ABF or the like may be used as a material that does not include the reinforcing material such as the glass fiber or the like. A photosensitive insulating material such as PID may be used, if necessary.

A build-up insulating layer 102 disposed as an outermost layer among the build-up insulating layers 102 may function as a solder resist layer, and may have openings externally exposing at least portions of the wiring layer 201.

Vias 401 may penetrate through at least portions of the insulating body 100, and electrically connect the wiring layers 201 to each other. A material of each of the vias 401 may be a metal material such as copper (Cu), aluminum (Al), silver (Ag), tin (Sn), gold (Au), nickel (Ni), lead (Pb), titanium (Ti), or alloys thereof. The vias 401 may include signal vias, ground vias, power vias, and the like, depending on a design. Each of the vias 401 may be formed by completely filling each of via holes with the metal material or be formed by forming the metal material along a wall of each of via holes. Each of the vias 401 may also be formed by a process such as an AP, an SAP, a MSAP, TT, or the like, and may include a seed layer, an electroless plating layer, and an electroplating layer formed on the basis of the seed layer. Each of the vias may have a tapered shape of which a width of a lower surface is greater than that of an upper surface or a tapered shape of which a width of an upper surface is greater than that of a lower surface.

In the printed circuit board 100A according to the first exemplary embodiment, the first fillers 120 may be dispersed and disposed in a powder form in the insulating resin 110, and may have a core-shell structure. The first fillers 120 may be included in the insulating resin 110, such that a physical property of the insulating body 100 may be reinforced.

The first filler 120 may have a core-shell structure including the core 121 and the shell 122, and a typical example of a material used as a material of the core 121 may include silica ($SiO_2$), alumina ($Al_2O_3$), and the like. Therefore, the core 121 of the first filler 120 in the printed circuit board 100A according to the first exemplary embodiment may include a first inorganic oxide including at least one of silica ($SiO_2$) and alumina ($Al_2O_3$).

In the present disclosure, a term "oxide" refers to a compound that contains one or more oxygen atoms and other elements and does not contain carbon.

The silica ($SiO_2$) of the first inorganic oxide described above may have a significantly low coefficient of thermal expansion (CTE) of about 0.5 ppm/K to significantly contribute to reduction of a coefficient of thermal expansion. Since the material having the low coefficient of thermal expansion (CTE) as described above is used as the material of the core 121, the insulating layer 101 of the printed circuit board 100A according to the present disclosure may have a low coefficient of thermal expansion (CTE), which may be advantageous in subsequently controlling warpage and preventing a thermal expansion-related defect with other components.

As described above, the material having the low coefficient of thermal expansion (CTE) may be included as the material of the core 121, and a coefficient of thermal expansion (CTE) of the core 121 may thus be relatively lower than that of the shell 122.

Meanwhile, a material of the shell 122 of the first filler 120 may be a material having a high dielectric constant (Dk). The shell 122 may include one or more ferroelectric materials. For example, a second inorganic oxide including at least one of $BaTiO_3$, $BaSrTiO_3$, $PbZrTiO_3$, $PdLaTiO_3$, $PdLaTiO_3$, $PdLaZrTiO_3$, $PdMgNbO_3$, and $CaCuTiO_3$, or mixtures thereof may be used as the material of the shell 122.

As an example, when the barium titanate ($BaTiO_3$) is used as the material of the shell 122 of the first filler 120, the insulating layer 101 of the printed circuit board 100A according to the first exemplary embodiment may have a high dielectric constant due to a high dielectric constant of the barium titanate. As described above, the shell 122 may include a material having a dielectric constant (Dk) relatively higher than that of the core 121.

As a result, at least a part of the insulating body 100 of the printed circuit board 100A according to the first exemplary embodiment may have a structure in which the first fillers 120 having characteristics that the dielectric constant of the shell 122 is higher than that of the core 121 are dispersed in the insulating resin 110.

As described above, the first fillers 120 each including the core 121 having the low coefficient of thermal expansion (CTE) and the shell 122 having the high dielectric constant may be dispersed in the insulating resin 110, such that the printed circuit board 100A according to the first exemplary embodiment may have characteristics of a high dielectric constant (Dk).

Therefore, occurrence of a warpage phenomenon in the printed circuit board 100A due to a difference in a coefficient of thermal expansion (CTE) between the insulating body 100 and the wiring layer 201 or the insulating body 100 and the antenna pattern 301 may be suppressed, and the printed circuit board 100A may have the high dielectric constant (Dk) to prevent signal loss at the time of transferring a high frequency signal.

In addition, when the printed circuit board 100A according to the first exemplary embodiment is used as a board that may be used at the time of transmitting a high frequency signal, such as an antenna board, an area of the antenna pattern 301 may be reduced, such that the printed circuit board 100A may have excellent characteristics in terms of miniaturization of the printed circuit board and reduction of the signal loss.

A coefficient of thermal expansion (CTE) and a dielectric constant (Dk) of at least a part of the insulating body 100 of the printed circuit board 100A according to the first exemplary embodiment may be adjusted if necessary and depending on a design by adjusting a content of the first fillers 120 having the core-shell structure described above and dispersed in the insulating resin 110.

Therefore, as an amount of the first fillers 120 included in the insulating resin 110 becomes larger, the insulating body 100 having a lower coefficient of thermal expansion (CTE) and a higher dielectric constant may be manufactured, and physical properties of the insulating body 100 and the printed circuit board 100A may be adjusted by adjusting a content of the first fillers 120, if necessary.

In the insulating body 100 of the printed circuit board 100A according to the first exemplary embodiment, a coating of the shell 122 formed on the surface of the core 121 may be formed by precipitating an oxide material formed from any number of solution compositions on the core 121, and may thus also be referred to as wet treatment. In addition, a surface coating of the core 121 may also be formed by vapor phase deposition.

The wet treatment or the coating described above may be performed using at least one of a spray coating method, a spin coating method, a dip coating method, a gravure coating method, a doctor blade method, a drawdown rod method, a wire wound rod method, a casting knife method, an air knife method, a roll method, a brush method, a squeeze roll method, a kiss roll method, a calendaring method, a powder coating method, an electrostatic coating method, a vapor deposition method, and a sputtering method on a conductive metal foil.

In a casting or coating process from a solvent, the solvent may be removed using a coagulation or evaporation process. Some polymers such as a polyamic acid or epoxy may additionally require a curing process in order to achieve a final compound or reach a desired level of physical properties. The curing process may be performed sequentially with the coating or casting process, or may be performed as a step independent from the coating or casting process. In the latter case, a so-called Green or B-stage film/coating may be first prepared.

The insulating resin 110 in a final structure may be uniaxially or biaxially oriented using a general method such as extending, blowing, or tentering, but is not limited thereto.

The printed circuit board 100A according to the first exemplary embodiment described above has been described on the basis of the insulating body 100 having a structure in which the first fillers 120 are dispersed in the insulating resin 110. However, this is not necessarily applied to all the insulating layers 101 and the build-up insulating layers 102 in the insulating body 100. For example, the first fillers 120 having the core-shell structure described above may also be applied only to at least a part of the insulating body 100.

In this case, the remaining part of the insulating body 100 to which the first fillers 120 having the core-shell structure are not applied may include a general insulating material. The insulating material may be a thermosetting resin such as an epoxy resin or a thermoplastic resin such as a polyimide resin. Alternatively, the insulating material may be a material having a reinforcing material such as an inorganic filler such as silica, a glass fiber, or the like, included in the thermosetting resin and the thermoplastic resin. The insulating material may be, for example, prepreg, but is not limited thereto. For example, ABF may be used as the insulating material. The ABF may be provided in a resin coated copper (RCC) form, but is not limited thereto. A photosensitive material such as PID may be used as the insulating material, if necessary.

Figure 4:
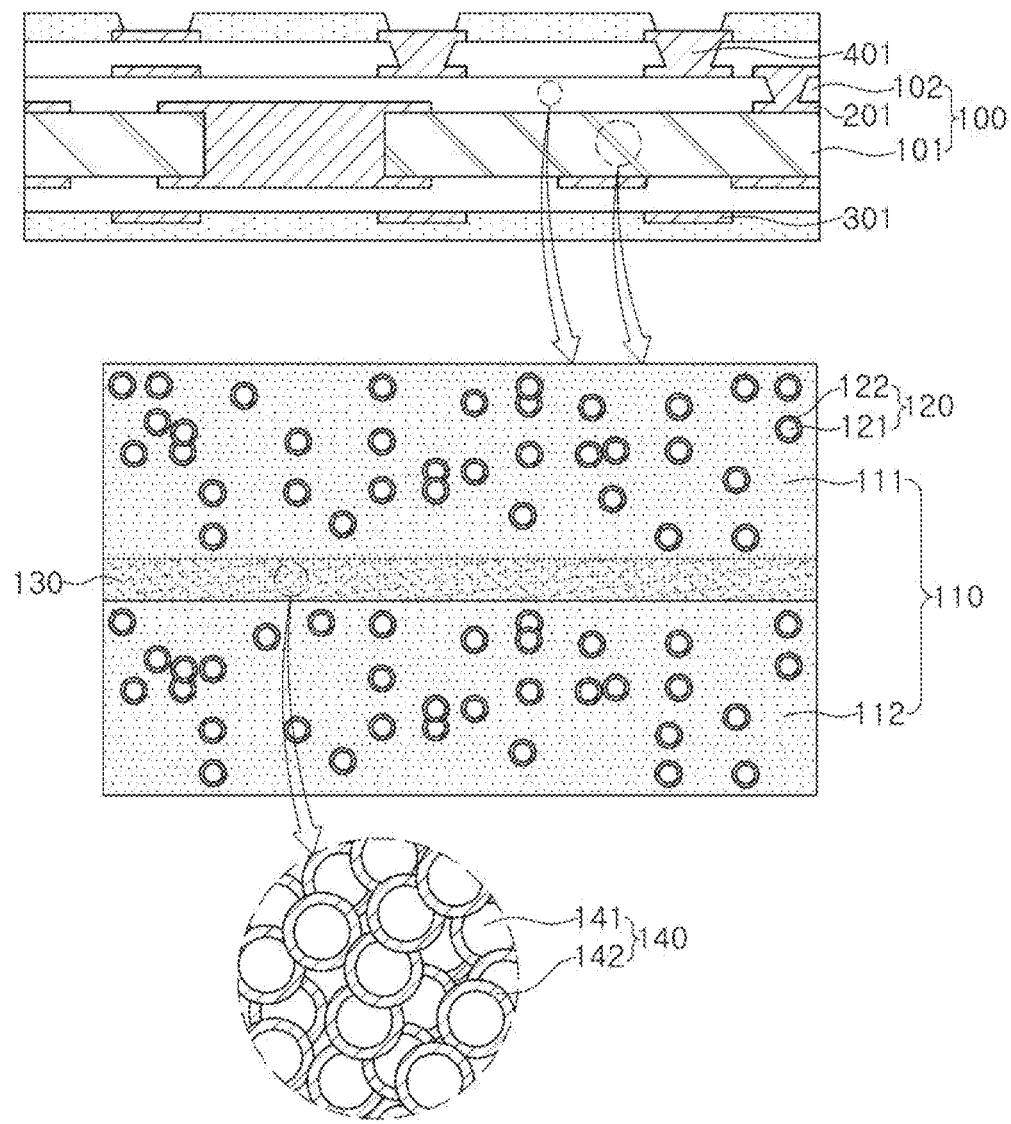
FIG. 4 is a schematic cross-sectional view illustrating a printed circuit board according to a second exemplary embodiment in the present disclosure.

FIG. 4 is a schematic cross-sectional view illustrating a printed circuit board according to a second exemplary embodiment in the present disclosure.

The printed circuit board 100B according to the second exemplary embodiment may be different in a structure of at least a part of an insulating body 100 from the printed circuit board 100A according to the first exemplary embodiment. Specifically, at least a part of the insulating body 100 of the printed circuit board 100B according to the second exemplary embodiment may have a configuration in which the insulating resin 110 used in the printed circuit board 100A according to the first exemplary embodiment described above includes a plurality of insulating resins 111 and 112 each disposed in a plurality of layers and an insulating sheet 130 is additionally disposed between the first and second insulating resins 111 and 112.

Therefore, the description for the printed circuit board 100A according to the first exemplary embodiment described above may similarly be applied as a description for the insulating resin 110 included in at least a part of the insulating body 100 and the first fillers 120 dispersed in the insulating resin 100, and contents of the printed circuit board 100B different from the printed circuit board 100A according to the first exemplary embodiment will hereinafter be mainly described.

At least a part of the insulating body 100 of the printed circuit board 100B according to the second exemplary embodiment may further include the insulating sheet 130 disposed between the first and second insulating resins 111 and 112. In this case, as illustrated in an enlarged view of FIG. 4, the insulating sheet 130 may function as a core within the respective insulating layers 101 or build-up insulating layers 102, and at least a part of the insulating body 100 of the printed circuit board 100B may have a structure in which the insulating sheets 130 of a plurality of layers and the insulating resins 110 of the plurality of layers are alternatively disposed within the insulating layers 101 or the build-up insulating layers 102. In addition, a configuration of the printed circuit board 100B including the first and second insulating resins 111 and 112 having a two-layer structure and the insulating sheet 130 having a one-layer structure is illustrated in FIG. 4, but the printed circuit board may include insulating resins or insulating sheets more than those illustrated in FIG. 4, which will be described in more detail in a description for a fourth exemplary embodiment to be provided below.

Each of the first and second insulating resins 111 and 112 may include first fillers 120 dispersed therein, each of the first fillers 120 may include a core 121 and a shell 122 coated on a surface of the core 121, the core 121 may include a material having a low coefficient of thermal expansion (CTE), such as silica ($SiO_2$), and the shell 122 may include a material having a high dielectric constant (Dk), such as barium titanate ($BaTiO_3$).

As described above, the first fillers 120 each including the core 121 having the low coefficient of thermal expansion (CTE) and the shell 122 having the high dielectric constant may be dispersed in the insulating resin 110, such that the printed circuit board 100B according to the second exemplary embodiment may have characteristics of a high dielectric constant (Dk).

Therefore, occurrence of a warpage phenomenon in the printed circuit board 100B due to a difference in a coefficient of thermal expansion (CTE) between the insulating body 100 and the wiring layer 201 or the insulating body 100 and the antenna pattern 301 may be suppressed, and the printed circuit board 100B may have the high dielectric constant (Dk) to prevent signal loss at the time of transferring a high frequency signal.

The insulating sheet 130 may be manufactured by mixing ceramic powders, a binder, and a solvent with one another to prepare slurry, and then manufacturing the slurry in a sheet shape having a thickness of several micrometers by a doctor blade method.

The ceramic powders included in the insulating sheet 130 may be referred to as second fillers 140, as an example. Optionally, the second fillers 140 may have a component and shape similar to those of the first fillers 120 dispersed in the insulating resin 110. That is, the second fillers 140 may also have a core-shell structure. Therefore, each of the second fillers 140 may also have a core 141 and a shell 142 coated on a surface of the core 141.

The second filler 140 in the insulating sheet 130 may include a silica-based inorganic oxide and a barium titanate-based inorganic oxide. In the present disclosure, the silica-based inorganic oxide refers to an inorganic oxide including silica ($SiO_2$), and the barium titanate-based inorganic oxide refers to an inorganic oxide including barium titanate ($BaTiO_3$). Specifically, the core 141 of the second filler 140 may include the silica-based inorganic oxide, and the shell 142 of the second filler 140 may include the barium titanate-based inorganic oxide.

In addition, a material of the second filler 140 may not be limited to the silica-based inorganic oxide described above. Specifically, the core 141 of the second filler 140 may include a first inorganic oxide including at least one of silica ($SiO_2$) and alumina ($Al_2O_3$) used as the material of the core 121 of the first filler 120.

In addition, a configuration of the shell 141 of the second filler 140 is not limited to the barium titanate-based inorganic oxide, and may further include another material having a high dielectric constant (Dk) as one or more ferroelectric materials, which are a material used as the material of the shell 122 of the first filler 120. For example, the shell 141 of the second filler 140 may include a second inorganic oxide selected from the group consisting of at least one of $BaTiO_3$, $BaSrTiO_3$, $PbZrTiO_3$, $PdLaTiO_3$, $PdLaTiO_3$, $PdLaZrTiO_3$, $PdMgNbO_3$, and $CaCuTiO_3$, or mixtures thereof.

As described above, the second filler 140 of the insulating sheet 130 may include the same components as those of the first filler 120 described above. In this case, the insulating sheet 130 may be manufactured by preparing slurry using the second fillers 140 including the first and second inorganic oxides described above and making the slurry a film, and may thus include a barium titanate ($BaTiO_3$)-based oxide and silica ($SiO_2$) having a density relatively higher than that of the insulating resin 110 including the first fillers 120.

In a description of the present disclosure, a term "density" may be a volume occupied by a corresponding component within a unit volume, rather than simply a density (volume/mass) of a physical term. In other words, the term "density" may correspond to a volume ratio of the corresponding component to another component to which the corresponding component belongs.

Alternatively, the term "density" may refer to a packing factor when the corresponding configuration is compared with another configuration to which the corresponding configuration belongs.

Therefore, a ratio in which the second fillers 140 per unit volume in the insulating sheet 130 fill the insulating sheet 130 may be greater than a ratio in which the first fillers 120 per the same unit volume in the insulating resin 110 fill the insulating resin 110.

Alternatively, a volume ratio or a volume fraction occupied by the second filler 140 within a predetermined volume in the insulating sheet 130 may be greater than a volume ratio or a volume fraction occupied by the first fillers 120 in the same volume of the insulating resin 110. The above description for the density may be applied to the following description for a density.

As described above, the second fillers 140 each including the core 141 having the low coefficient of thermal expansion (CTE) and the shell 142 having the high dielectric constant may be dispersed in the insulating sheet 130, such that the printed circuit board 100B according to the second exemplary embodiment may have characteristics of a higher dielectric constant (Dk).

Therefore, occurrence of a warpage phenomenon in the printed circuit board 100B due to a difference in a coefficient of thermal expansion (CTE) between the insulating body 100 and the wiring layer 201 or the insulating body 100 and the antenna pattern 301 may be suppressed, and the printed circuit board 100B may have the high dielectric constant (Dk) to prevent signal loss at the time of transferring a high frequency signal.

In addition, as described above, the density of the second fillers 140 per unit volume in the insulating sheet 130 may be higher than that of the first fillers 120 per unit volume in the insulating resin 110.

Therefore, the insulating body 100 of the printed circuit board 100B according to the second exemplary embodiment may have a structure in which the insulating sheet 130 including inorganic fillers having a relatively high density is disposed between the insulating resins 110.

The slurry may be prepared by uniformly mixing ceramic powders (ceramic raw material) and an additive and a sintering aid that have an influence on an electrical property with an organic solvent, a binder, a dispersant, and a binder resin. A barium titanate-based oxide ($BaTiO_3$) as a main component may be used as the ceramic raw material, and silica ($SiO_2$), a glass, and a metal oxide may be used as the additive and the sintering aid.

Any one selected from the group consisting of polyamino acid cellulose, polyvinyl butyral (PVB), polymethyl methacrylate (PMMA), and polyacryl esters, and combinations thereof may be used as the binder.

The dispersant may be a nonionic dispersant selected from the group consisting of fish oil, polyethylene glycol (PEG), alcohol polyoxyethylene ether (AE), monoglyceride, sorbitan ester, a nonionic surfactant, and combinations thereof.

The insulating sheet 130 may be manufactured by making the ceramic powders the slurry as described above, such that the insulating sheet 130 may include the second fillers 140 including the barium titanate-based oxide ($BaTiO_3$) and the silica ($SiO_2$) having densities higher than those of the insulating resin 110 described above within the same volume.

Therefore, when the printed circuit board 100B aims to have a low coefficient of thermal expansion (CTE) and a high dielectric constant (Dk), corresponding characteristics of the printed circuit board 100B may be improved by configuring the printed circuit board 100B so as to include the insulating sheet 130 as described above.

Meanwhile, in a case of the printed circuit board 100B according to the second exemplary embodiment, an amount of the first fillers 120 in the insulating resin 110 may be reduced by using the insulating sheet 130 between the first and second insulating resins 111 and 112 while the insulating body 100 maintains the same coefficient of thermal expansion (CTE) and dielectric constant (Dk) characteristics.

As a content of the first fillers 120 included in the insulating layers 101 and 102 inside the printed circuit board 100B becomes larger, lower coefficient of thermal expansion (CTE) and higher dielectric constant (Dk) characteristics may be implemented, but when the content of the first fillers 120 is increased to a specific value or more, a phenomenon in which an amount of the first fillers 120 exposed to surfaces of the insulating layers 101 and 102 is increased, such that an adhesion force with other circuit patterns or the wiring layers disposed on the surfaces is reduced may occur.

In relation to this, at least a part of the insulating body 100 of the printed circuit board 100B according to the second exemplary embodiment may include the insulating sheet 130 including high-density ceramic raw materials, such that a relatively small amount of first fillers 120 may be exposed to a surface of the insulating resin 110.

As a result, in a layer including the insulating sheet 130 described above in the insulating body 100, an adhesion force with circuit patterns or a metal material disposed on the surface of the insulating layer 101 or the build-up insulating layer 102 in the insulating body 100 may be secured by reducing an amount of the first fillers 120 exposed to a surface of the printed circuit board 100B while maintaining a lower coefficient of thermal expansion (CTE) and a higher dielectric constant (Dk).

In addition, when the content of the first fillers 120 is excessively large, brittleness of the insulating body 100 may become high, such that the insulating body 100 may be brittle. However, in the printed circuit board 100B according to the second exemplary embodiment, the insulating sheet 130 including the high-density second fillers 140 may be disposed between the insulating resins 110 of the insulating body 100. Therefore, even though a relatively small amount of first fillers 120 are included in the insulating resin 110, the same dielectric constant (Dk) and coefficient of thermal expansion (CTE) may be maintained, and a problem that the printed circuit board 100B is damaged due to the brittleness of the insulating body 100 may thus be prevented.

Meanwhile, since the insulating sheet 130 includes the high-density second fillers 140, the amount of the first fillers 120 included in the insulating resin 110 may be reduced to reduce signal loss at the time of transmitting a high frequency signal while securing an adhesion force and to maintain a low shrinkage rate and a high dielectric constant at the time of high speed transmission, such that when the printed circuit board 100B is used in an antenna region in which antenna patterns of an antenna board are disposed, the antenna patterns may be miniaturized.

Figure 5:
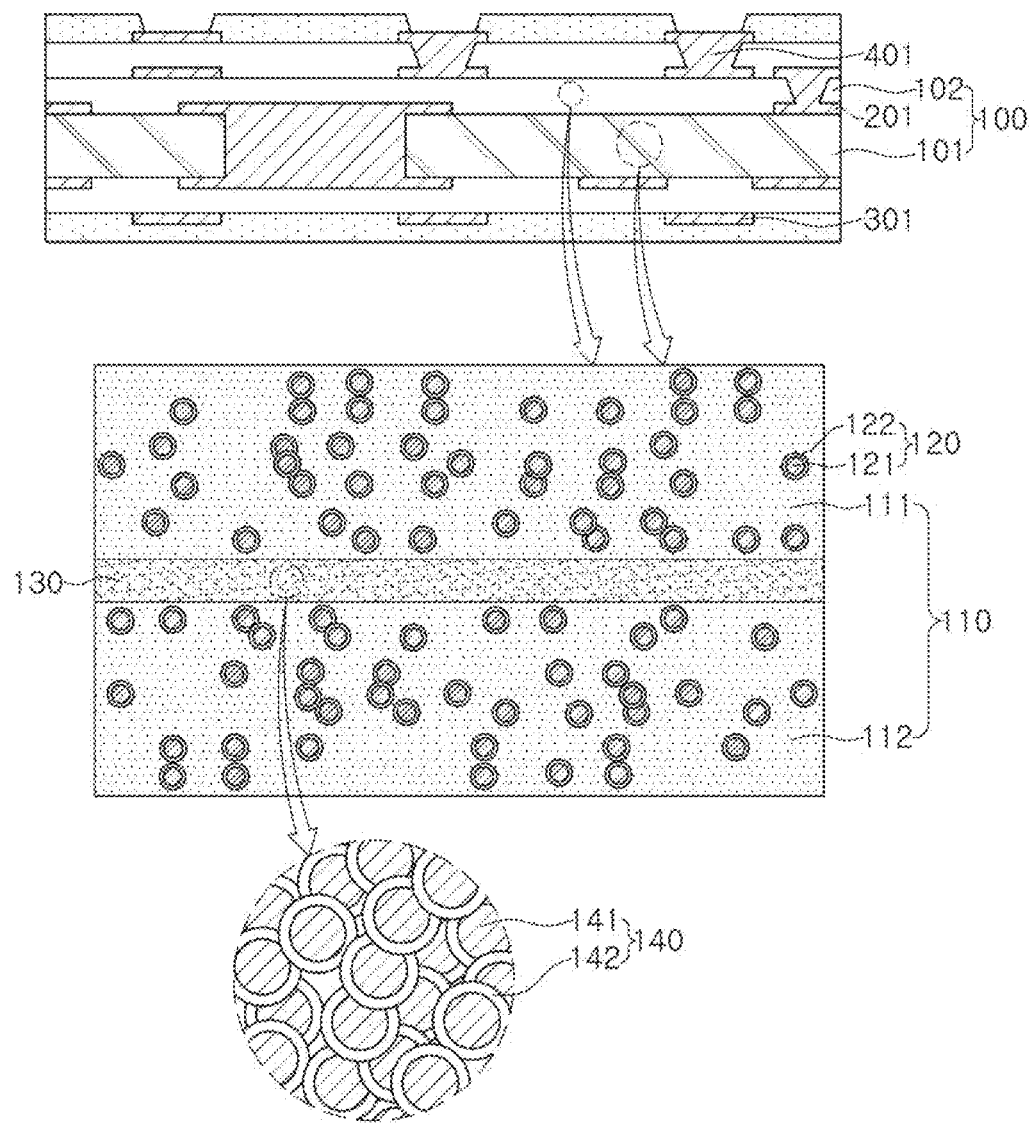
FIG. 5 is a schematic cross-sectional view illustrating a printed circuit board according to a third exemplary embodiment in the present disclosure.

FIG. 5 is a schematic cross-sectional view illustrating a printed circuit board according to a third exemplary embodiment in the present disclosure.

The printed circuit board 100C according to the third exemplary embodiment may be different in a structure of a first filler 120 in an insulating resin 110 from the printed circuit board 100B according to the second exemplary embodiment described above.

Therefore, the description for the printed circuit board 100B according to the second exemplary embodiment described above may similarly be applied as a description for dispositions of the insulating resin 110 and the insulating sheet 130, and contents of the printed circuit board 100C different from the printed circuit board 100B according to the second exemplary embodiment will hereinafter be mainly described.

Referring to FIG. 5, the printed circuit board 100C according to the third exemplary embodiment may have a structure in which the first fillers 120 are included and dispersed in a powder form in the insulating resin 110, similar to the printed circuit boards 100A and 100B according to the first and second exemplary embodiments described above. In this case, the first fillers 120 included in the printed circuit board 100C according to the third exemplary embodiment may have a core-shell structure including a core 121 and a shell 122 coated on a surface of the core 121, similar to the first and second exemplary embodiments, but a specific configuration of the core-shell structure of the first fillers 120 may be different from those of the printed circuit boards 100A and 100B according to the first and second exemplary embodiments.

In the printed circuit board 100C according to the third exemplary embodiment illustrated in FIG. 5, the first filler 120 may have a structure in which materials of the core 121 and the shell 122 are inverted as compared with the printed circuit boards 100A and 100B according to the first and second exemplary embodiments.

Specifically, the core 121 included in each of the first fillers 120 included in at least a part of the insulating body 100 of the printed circuit board 100C according to the third exemplary embodiment may be formed of a material having a high dielectric constant (Dk). For example, the core 121 may include a second inorganic oxide selected from the group consisting of at least one of $BaTiO_3$, $BaSrTiO_3$, $PbZrTiO_3$, $PdLaTiO_3$, $PdLaTiO_3$, $PdLaZrTiO_3$, $PdMgNbO_3$, and $CaCuTiO_3$, or mixtures thereof.

On the other hand, the shell 122 included in each of the first fillers 120 included in at least a part of the insulating body 100 of the printed circuit board 100C according to the third exemplary embodiment and coated on a surface of the core 121 may include a material having a low coefficient of thermal expansion (CTE). For example, the shell 122 may include a first inorganic oxide including at least one of silica ($SiO_2$) and alumina ($Al_2O_3$).

As described above, the insulating layers 101 and 102 of the printed circuit board 100C according to the third exemplary embodiment may also have a structure in which the first fillers 120 including the material having the low coefficient of thermal expansion (CTE) and the material having the high dielectric constant (Dk) are dispersed in the insulating resin 110.

As described above, the first fillers 120 each including the core 121 having the high dielectric constant (Dk) and the shell 122 having the low coefficient of thermal expansion (CTE) may be dispersed in the insulating resin 110, such that the printed circuit board 100C according to the third exemplary embodiment may have characteristics of a low coefficient of thermal expansion (CTE) and a high dielectric constant (Dk).

Therefore, occurrence of a warpage phenomenon in the printed circuit board 100C due to a difference in a coefficient of thermal expansion (CTE) between the insulating body 100 and the wiring layer 201 or the insulating body 100 and the antenna pattern 301 may be suppressed, and the printed circuit board 100C may have the high dielectric constant (Dk) to prevent signal loss at the time of transferring a high frequency signal.

In addition, the printed circuit board 100C may have the high dielectric constant (Dk) characteristics, and may thus have characteristics advantageous in transferring the high frequency signal at the time of transmitting the high-frequency signal, and when the printed circuit board 100C is used as an antenna board, it may be advantageous in miniaturizing antenna patterns.

As described above, the printed circuit board 100C according to the third exemplary embodiment may have a form in which the core-shell structure of the first filler 120 in the insulating resin 110 is inverted as compared with the printed circuit boards 100A and 100B according to the first and second exemplary embodiments.

Therefore, when the same content of first fillers 120 are included in the insulating resins 110 of the same volume of the same insulating layers 101 and 102, the printed circuit board 100C may have characteristics of a dielectric constant (Dk) relatively higher than that of the printed circuit boards 100A and 100B according to the first and second exemplary embodiments.

The reason is that the barium titanate-based inorganic oxide, a material having a high dielectric constant, thinly coated as the shell 122 on the surface of the core 121 in the printed circuit boards 100A and 100B according to the first and second exemplary embodiments may function as the core 121 of the first filler 120 in the printed circuit board 100C according to the third exemplary embodiment.

In addition, in the printed circuit board 100C according to the third exemplary embodiment, the insulating sheet 130 may be disposed between the insulating layers 110 configured as a plurality layers, similar to the structure of the printed circuit board 100B according to the second exemplary embodiment. Also, the printed circuit board 100C according to the third exemplary embodiment may have an insulating layer including second fillers 140 having a high density. The second fillers 140 may include a material having a high dielectric constant (Dk) and a low coefficient of thermal expansion (CTE), and may be distributed at a high density in the insulating sheet 130.

Here, the second fillers 140 included in the insulating sheet 130 of the printed circuit board 100C may have a core-shell structure including a core 141 and a shell 142 coated on a surface of the core 141, similar to the second exemplary embodiments, but a specific configuration of the core-shell structure of the first fillers 140 are different.

Specifically, in the printed circuit board 100C according to the third exemplary embodiment illustrated in FIG. 5, the second filler 140 may have a structure in which materials of the core 141 and the shell 142 are inverted as compared with the insulating sheet 130 of the printed circuit boards 100B described in FIG. 4.

Therefore, the core 141 included in each of the second fillers 140 included in at least a part of the insulating sheet 130 of the printed circuit board 100C according to the third exemplary embodiment may be formed of a material having a high dielectric constant (Dk). For example, the core 141 may include a second inorganic oxide selected from the group consisting of at least one of $BaTiO_3$, $BaSrTiO_3$, $PbZrTiO_3$, $PdLaTiO_3$, $PdLaTiO_3$, $PdLaZrTiO_3$, $PdMgNbO_3$, and $CaCuTiO_3$, or mixtures thereof.

On the other hand, the shell 142 included in each of the second fillers 140 included in at least a part of the insulating sheet 130 of the printed circuit board 100C according to the third exemplary embodiment and coated on a surface of the core 141 may include a material having a low coefficient of thermal expansion (CTE). For example, the shell 142 may include a first inorganic oxide including at least one of silica ($SiO_2$) and alumina ($Al_2O_3$).

As above, the second filler 140 of the insulating sheet 130 may include the same components as those of the first filler 120 described above in third exemplary embodiment. In this case, the insulating sheet 130 may be manufactured by preparing slurry using the second fillers 140 including the first and second inorganic oxides described above and making the slurry a film, and may thus include a barium titanate ($BaTiO_3$)-based oxide and silica ($SiO_2$) having a density relatively higher than that of the insulating resin 110 including the first fillers 120.

Therefore, a density of the second fillers 140 per unit volume in the insulating sheet 130 may be higher than that of the first fillers 120 per unit volume in the insulating resin 110. As a result, the insulating body 100 of the printed circuit board 100C according to the third exemplary embodiment may also have a structure in which the insulating sheet 130 including inorganic fillers having a relatively high density is disposed between the insulating resins 110.

According to the structure of the printed circuit board 100C according to the third exemplary embodiment described above, even though a content of the first fillers 120 in the insulating resin 110 is reduced, characteristics of a high dielectric constant (Dk) and a low coefficient of thermal expansion (CTE) may be maintained due to the insulating sheet 130.

In addition, as the content of the first fillers 120 is reduced, an amount of the first fillers 120 exposed to a surface of the printed circuit board 100C may be reduced, and an adhesion force between other external circuit patterns or wiring layer and the printed circuit board 100C may resultantly be secured.

Figure 6:
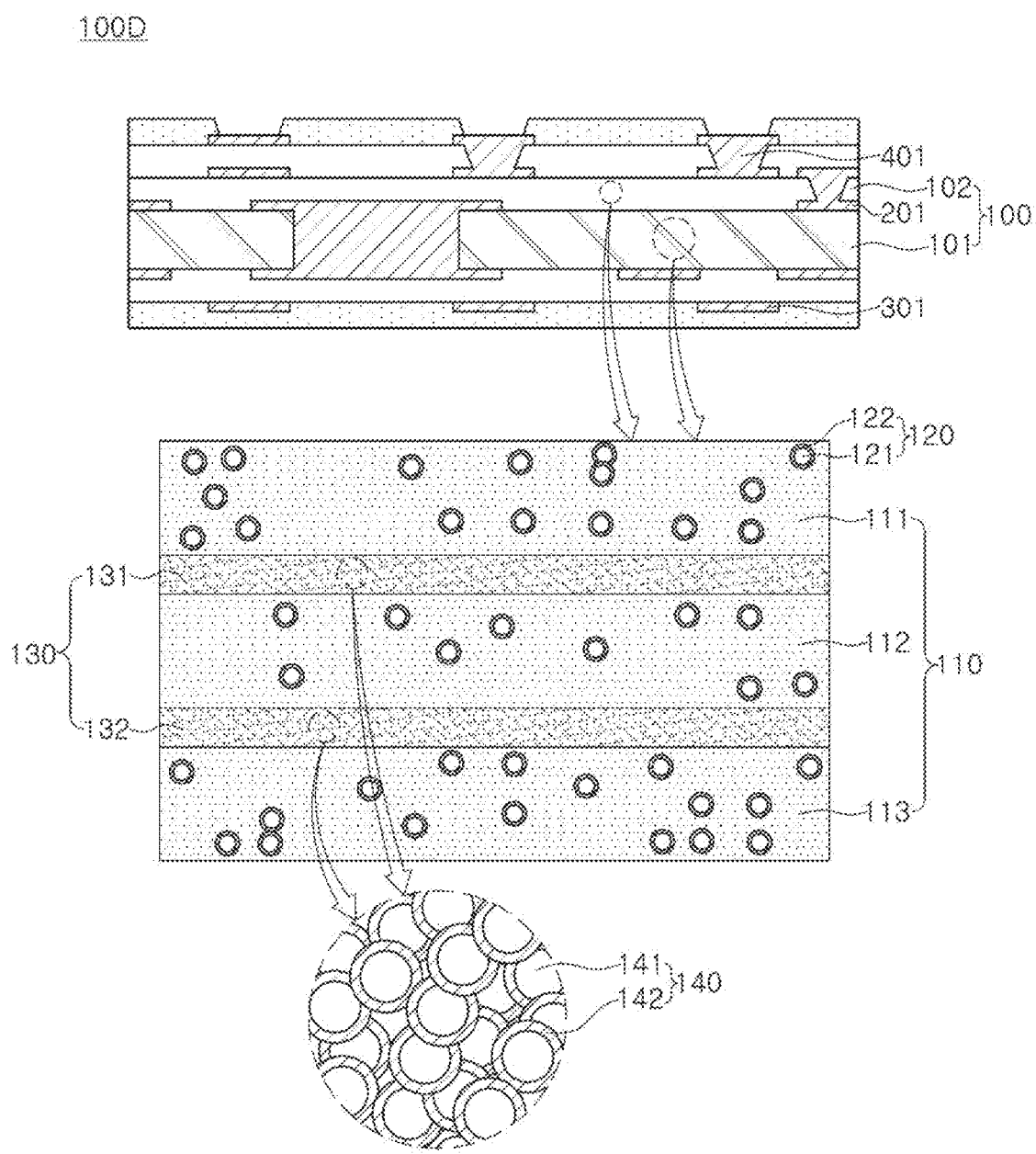
FIG. 6 is a schematic cross-sectional view illustrating a printed circuit board according to a fourth exemplary embodiment in the present disclosure.

FIG. 6 is a schematic cross-sectional view illustrating a printed circuit board according to a fourth exemplary embodiment in the present disclosure.

The printed circuit board 100D according to the fourth exemplary embodiment may be different in a structure of an insulating sheet 130 of an insulating body 100 from the printed circuit board 100B according to the second exemplary embodiment illustrated in FIG. 4.

Therefore, the description for the printed circuit board 100B according to the second exemplary embodiment described above may similarly be applied as a description for a structure and a physical property of each of an insulating resin 110 and first fillers 120 in the insulating body 100, and contents of the printed circuit board 100D different from the printed circuit board 100B according to the second exemplary embodiment will hereinafter be mainly described.

Referring to FIG. 6, in the printed circuit board 100D according to the fourth exemplary embodiment, the insulating sheet 130 in at least a part of the insulating body 100 may be configured as a plurality of layers to include first and second insulating sheets 131 and 132, and the insulating resin 110 may also include first to third insulating resins 111, 112, and 113 of a plurality of layers.

Therefore, as compared with the fact that the insulating sheets 130 may be disposed between the first and second insulating resins 111 and 112 in each insulating layer 101 or build-up insulating layer 102 of FIGS. 4 and 5 and function as a core layer, the printed circuit board 100D according to the fourth exemplary embodiment may have a structure in which the insulating resins 111, 112, and 113 and the insulating sheets 131 and 132 are alternately stacked in the insulating layer 101 or the build-up insulating layer 102.

The same description as the description for the insulating sheet 130 of the printed circuit boards 100B and 100C according to the second and third exemplary embodiments described above may be applied as a description for the first and second insulating sheets 131 and 132. Therefore, each of the first and second insulating sheets 131 and 132 may be manufactured by mixing a material having a low coefficient of thermal expansion (CTE), such as silica ($SiO_2$) with a material having a high dielectric constant (Dk), such as barium titanate ($BiTiO_3$) in a slurry form and then making a shape of the mixture in the slurry form a film shape.

In the printed circuit board 100D according to the fourth exemplary embodiment, the first and second insulating sheets 131 and 132 may be disposed between the first to third insulating resins 111, 112, and 113, respectively, in at least one layer of the insulating body 100, such that second fillers 140 having a higher density may be included in the printed circuit board 100D.

Therefore, the printed circuit board 100D may include materials having a low coefficient of thermal expansion (CTE) and materials having a high dielectric constant (Dk) at a higher density. Accordingly, even though a relatively small amount of first fillers 120 are included in the first to third insulating resins 111, 112, and 113, characteristics of a low coefficient of thermal expansion (CTE) and a high dielectric constant (Dk) may be exhibited due to the second fillers 140 in the first and second insulating sheets 131 and 132.

In addition, as compared with the insulating body 100 of the printed circuit board 100B according to the second exemplary embodiment illustrated in FIG. 4, the printed circuit board 100D according to the fourth exemplary embodiment illustrated in FIG. 6 may include the first and second insulating layers 131 and 132 of the plurality of layers, and a content of the first fillers 120 in the printed circuit board 100D may thus be reduced while maintaining a dielectric constant (Dk) and a coefficient of thermal expansion (CTE) similar to those of the printed circuit board 100B according to the second exemplary embodiment.

Therefore, as illustrated in FIG. 6, a density of the first fillers 120 in each of the first to third insulating resins 111, 112, and 113 of the plurality of layers may be lower than that of the first fillers 120 in each of the insulating resins 111 and 112 of the printed circuit board 100B according to the second exemplary embodiment.

As a result, an amount of the first fillers 120 exposed to an outer surface of the insulating body 100 may be reduced, and an adhesion force with the wiring layer 201 or the antenna pattern 301 disposed on the surface of the insulating body 100 may further be increased.

Meanwhile, a structure in which the first and second insulating sheets 131 and 132 of two layers are included between the first to third insulating resins 111, 112, and 113 of three layers, respectively, in at least one layer of the insulating body 100 has been illustrated in FIG. 6, insulating resins 110 and/or insulating sheets 130 more than those illustrated in FIG. 6 may be included in the insulating body 100 or insulating resins 110 and/or insulating sheets 130 less than those illustrated in FIG. 6 may be included in the insulating body 100.

As described above, an additional insulating sheet 130 may further be disposed, such that a content of the first fillers 120 in the insulating resin 110 may further be reduced.

Therefore, an adhesion force between the insulating body 100 and the wiring layer 201 or the antenna pattern 301 may further be secured.

Figure 7:
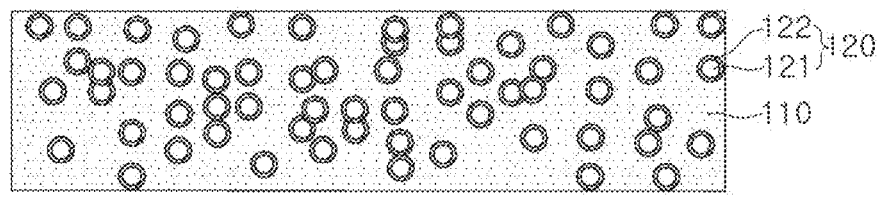
FIG. 7 is a schematic cross-sectional view illustrating an insulating film that may be used for manufacturing an insulating layer of the printed circuit board according to the first exemplary embodiment in the present disclosure.

FIG. 7 is a schematic cross-sectional view illustrating an insulating film that may be used for manufacturing the insulating layer of the printed circuit board according to the first exemplary embodiment in the present disclosure.

The insulating film 100E of FIG. 7 may be protected by disposing protective films formed of polyethylene terephthalate (PET), polyimide (PI), polypropylene (PP), polyethylene (PE), or the like, as protective layers on and beneath the insulating film 100E. Subsequently, when the insulating film 100E may be stacked on a structure such as a printed circuit board, the protective films may be removed.

The insulating film 100E may include an insulating resin 110 and first fillers 120 dispersed in a powder form in the insulating resin 110. In this case, the first filler 120 may include the core 121 including the material having the low coefficient of thermal expansion (CTE) and the shell 122 coated on the surface of the core 121 and including the material having the high dielectric constant (Dk), as described above.

Therefore, the insulating film 100E may have a low coefficient of thermal expansion (CTE) to suppress occurrence of warpage of the printed circuit board due to a difference in a coefficient of thermal expansion (CTE) between the insulating layer and the wiring layer within the printed circuit board, and may have a high dielectric constant (Dk) to prevent signal loss at the time of transferring a high frequency signal.

In addition, when the insulating film 100E is used for the antenna board, the insulating film 100E may include an antenna pattern, and a patch area of the antenna pattern may be reduced while maintaining signal characteristics, which may further be advantageous in miniaturization and thinness of the antenna pattern.

Other contents overlap those described above, and a detailed description thereof is thus omitted.

As set forth above, according to the exemplary embodiment in the present disclosure, an insulating layer capable of having a low coefficient of thermal expansion (CTE) and a printed circuit board including the same may be provided.

According to the exemplary embodiment in the present disclosure, an insulating layer having a high dielectric constant and a printed circuit board including the same may be provided.

While exemplary embodiments have been shown and described above, it will be apparent to those skilled in the art that modifications and variations could be made without departing from the scope of the present invention as defined by the appended claims.

What is claimed is:

1. A printed circuit board comprising:
an insulating layer including an insulating resin and first fillers dispersed in the insulating resin; and
a wiring layer disposed on the insulating layer,
wherein the first filler includes a core, and a shell coated on a surface of the core, and
the shell has a dielectric constant higher than that of the core.

2. The printed circuit board of claim 1, wherein the shell has a coefficient of thermal expansion (CTE) greater than that of the core.

3. The printed circuit board of claim 1, wherein the core includes a first inorganic oxide including at least one of silica ($SiO_2$) and alumina ($Al_2O_3$).

4. The printed circuit board of claim 1, wherein the shell includes a second inorganic oxide selected from the group consisting of at least one of $BaTiO_3$, $BaSrTiO_3$, $PbZrTiO_3$, $PdLaTiO_3$, $PdLaTiO_3$, $PdLaZrTiO_3$, $PdMgNbO_3$, and $CaCuTiO_3$, or mixtures thereof.

5. The printed circuit board of claim 1, wherein the insulating resin is configured as a plurality of resin layers, and
the insulating layer further includes an insulating sheet disposed between the plurality of resin layers.

6. The printed circuit board of claim 5, wherein the insulating sheet includes second fillers including a silica-based inorganic oxide and a barium titanate-based inorganic oxide.

7. The printed circuit board of claim 6, wherein a density of the second fillers per unit volume in the insulating sheet is higher than that of the first fillers per unit volume in the insulating resin.

8. The printed circuit board of claim 1, wherein the insulating layer and the wiring layer are configured as a plurality of layers and are alternately arranged, and
a via layer penetrating through at least one of the plurality of insulating layers and connecting the plurality of wiring layers to each other is further included in the printed circuit board.

9. The printed circuit board of claim 1, further comprising antenna patterns disposed on the insulating layer.

10. A printed circuit board comprising:
a plurality of insulating layers;
a plurality of wiring layers disposed on or between the plurality of insulating layers; and
a via layer penetrating through at least one of the plurality of insulating layers and connecting the plurality of wiring layers to each other,
wherein at least one of the plurality of insulating layers includes an insulating sheet and insulating resins disposed on both surfaces of the insulating sheet,
the insulating resins and the insulating sheet include first and second fillers, respectively, and
a density of the second fillers per unit volume in the insulating sheet is higher than that of the first fillers per unit volume in each of the insulating resins.

11. The printed circuit board of claim 10, wherein each of the first and second fillers includes a core, and a shell coated on a surface of the core.

12. The printed circuit board of claim 11, wherein the shell has a dielectric constant higher than that of the core.

13. The printed circuit board of claim 12, wherein the shell has a coefficient of thermal expansion (CTE) greater than that of the core.

14. The printed circuit board of claim 11, wherein the core has a dielectric constant higher than that of the shell, and
the core has a coefficient of thermal expansion (CTE) greater than that of the shell.

15. The printed circuit board of claim 11, wherein the core includes a first inorganic oxide including at least one of silica ($SiO_2$) and alumina ($Al_2O_3$), and
the shell includes a second inorganic oxide selected from the group consisting of at least one of $BaTiO_3$, $BaSrTiO_3$, $PbZrTiO_3$, $PdLaTiO_3$, $PdLaTiO_3$, $PdLaZrTiO_3$, $PdMgNbO_3$, and $CaCuTiO_3$, or mixtures thereof.

16. The printed circuit board of claim 10, wherein the insulating sheet of each of the plurality of insulating layers is configured as a plurality of layers, and
the insulating resins of the plurality of layers and the insulating sheets of the plurality of layers are alternately disposed.

17. The printed circuit board of claim 10, wherein one of the plurality of wiring layers antenna patterns.

18. An insulating film comprising:
an insulating resin; and
fillers dispersed in the insulating resin and each including a core, and a shell coated on a surface of the core,
wherein the shell has a dielectric constant higher than that of the core, and
the shell has a coefficient of thermal expansion (CTE) greater than that of the core.

19. The insulating film of claim 18, wherein the core includes silica ($SiO_2$) or alumina ($Al_2O_3$), and
the shell includes one selected from the group consisting of $BaTiO_3$, $BaSrTiO_3$, $PbZrTiO_3$, $PdLaTiO_3$, $PdLaTiO_3$, $PdLaZrTiO_3$, $PdMgNbO_3$, and $CaCuTiO_3$, or a mixture of two or more of $BaTiO_3$, $BaSrTiO_3$, $PbZrTiO_3$, $PdLaTiO_3$, $PdLaTiO_3$, $PdLaZrTiO_3$, $PdMgNbO_3$, and $CaCuTiO_3$.

20. A printed circuit board comprising:
an insulating layer including an insulating resin and first fillers dispersed in the insulating resin; and
a wiring layer disposed on the insulating layer,
wherein the first filler includes a core including a first material, and a shell coated on a surface of the core and including a second material, and
one of the first material and the second material has a dielectric constant and a coefficient of thermal expansion (CTE) greater than the other of the first material and the second material.

21. The printed circuit board of claim 20, further comprising antenna patterns disposed on the insulating layer.

22. The printed circuit board of claim 20, wherein the first material includes one of silica ($SiO_2$) and alumina ($Al_2O_3$), and
the second material includes one selected from the group consisting of $BaTiO_3$, $BaSrTiO_3$, $PbZrTiO_3$, $PdLaTiO_3$, $PdLaTiO_3$, $PdLaZrTiO_3$, $PdMgNbO_3$, and $CaCuTiO_3$, or a mixture of two or more of $BaTiO_3$, $BaSrTiO_3$, $PbZrTiO_3$, $PdLaTiO_3$, $PdLaTiO_3$, $PdLaZrTiO_3$, $PdMgNbO_3$, and $CaCuTiO_3$ 23. A printed circuit board comprising:
a first wiring layer and a second wiring layer;
a first insulating resin layer and a second insulating resin layer disposed between the first wiring layer and the second wiring layer and each dispersed with fillers, wherein the fillers includes a core and a shell coated on the core and having a dielectric constant or a coefficient of thermal expansion (CTE) different from that of the core;
an insulating sheet disposed between the first insulating resin layer and the second insulating resin layer; and
a via layer extending between the first wiring layer and the second wiring layer and penetrating through the first insulating resin layer, the insulating sheet, and the second insulating resin layer.

24. The printed circuit board of claim 23, wherein in the fillers dispersed in the first insulating resin layer, the shell has the dielectric constant higher than that of the core.

25. The printed circuit board of claim 23, wherein in the fillers dispersed in the first insulating resin layer, the shell has the coefficient of thermal expansion (CTE) greater than that of the core.

26. The printed circuit board of claim 23, wherein the core includes one of a first inorganic oxide and a second inorganic oxide,
the shell includes the other of the first inorganic oxide and the second inorganic oxide,
the first inorganic oxide includes one of silica ($SiO_2$) and alumina ($Al_2O_3$), and
the second inorganic oxide includes one selected from the group consisting of $BaTiO_3$, $BaSrTiO_3$, $PbZrTiO_3$, $PdLaTiO_3$, $PdLaTiO_3$, $PdLaZrTiO_3$, $PdMgNbO_3$, and $CaCuTiO_3$, or a mixture of two or more of $BaTiO_3$, $BaSrTiO_3$, $PbZrTiO_3$, $PdLaTiO_3$, $PdLaTiO_3$, $PdLaZrTiO_3$, $PdMgNbO_3$, and $CaCuTiO_3$.

27. The printed circuit board of claim 23, further comprising antenna patterns connected to one or more of the first wiring layer and the second wiring layer.

* * * * *